(12) United States Patent
Lee

(10) Patent No.: US 7,447,090 B2
(45) Date of Patent: Nov. 4, 2008

(54) SEMICONDUCTOR MEMORY DEVICE

(75) Inventor: Chang-Hyuk Lee, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 12 days.

(21) Appl. No.: 11/647,400

(22) Filed: Dec. 29, 2006

(65) Prior Publication Data

US 2008/0084770 A1 Apr. 10, 2008

(30) Foreign Application Priority Data

Sep. 28, 2006 (KR) .................. 10-2006-0095186

(51) Int. Cl.
G11C 7/00 (2006.01)

(52) U.S. Cl. .............. 365/205; 365/194; 365/230.06

(58) Field of Classification Search .......... 365/205, 365/194, 230.06, 230.08, 189.06, 189.05
See application file for complete search history.

(56) References Cited

U.S. PATENT DOCUMENTS 5,608,688 A * 3/1997 Park ..................... 365/233.5
5,768,201 A 6/1998 Oh
6,144,230 A * 11/2000 Kim ..................... 365/205
7,002,862 B2 2/2006 Kang
7,230,862 B2 * 6/2007 Kim et al. ............... 365/194
2004/0240293 A1 12/2004 Lee

FOREIGN PATENT DOCUMENTS

JP 2002-230978 8/2002

* cited by examiner

*Primary Examiner*—David Lam
(74) *Attorney, Agent, or Firm*—McDermott Will & Emery LLP

(57) ABSTRACT

A semiconductor memory device includes: a first bit line sense amplifier array for amplifying a data input to a first bit line pair coupled to cells; a second bit line sense amplifier array for amplifying a data input to a second bit line pair coupled to the cells; and a control unit for activating one of the first and second bit line sense amplifier arrays and, after a predetermined time, for activating the other bit line sense amplifier array in response to an active signal and a column address information signal.

14 Claims, 6 Drawing Sheets

SEMICONDUCTOR MEMORY DEVICE

CROSS-REFERENCE TO RELATED APPLICATIONS

The present invention claims priority of Korean patent application number 10-2006-0095186, filed on Sep. 28, 2006, which is incorporated by reference in its entirety.

BACKGROUND OF THE INVENTION

The present invention relates to semiconductor design technology, and more particularly, to a control circuit for controlling a bit line sense amplifier array.

As a cell size and a wire width are decreased, a voltage level of a power supply voltage is decreased. Therefore, it is required to develop a design technology suitable for low-power condition. Further, it is required to reduce the power consumption of a semiconductor memory device.

FIG. 1 is a block diagram showing a bit line sense amplifier array and a peripheral circuit included in a conventional semiconductor memory device.

As shown, the conventional semiconductor memory device includes a sense amplifier driving control unit 10 for generating driving control signals SAN, BLEQ and SAP in response to an active signal ACT; a column address decoder 20 for generating a column selection signal YI<0:255> by decoding a column address signal YA<0:7>; and a bit line sense amplifier array 30 for receiving the column selection signal YI<0:255> and the driving control signals SAN, BLEQ and SAP.

The bit line sense amplifier array 30 generates a driving voltage according to the driving control signals SAN, BLEQ and SAP, and a bit line sense amplifier supplied with the driving voltage amplifies a data input to a bit line pair BL and /BL.

Herein, the column selection signal YI<0:255> is for reading the amplified data of the bit line pair BL and /BL for a data access operation, e.g., a read operation. That is, the column selection signal YI<0:255> is used for reading a required data among amplified data of 256 bit line pairs.

FIG. 2 is a block diagram depicting the bit line sense amplifier array 30 shown in FIG. 1.

As shown, the bit line sense amplifier array 30 includes a plurality of driving voltage generation units 31A and 32A for receiving the driving control signals SAN, BLEQ and SAP in order to generate a driving voltage; and a plurality of bit line sense amplifier mats 31B and 32B each of which includes a plurality of bit line sense amplifiers, e.g., SA1 to SA4, for performing an amplifying operation using the driving voltage. Herein, a structure of the driving voltage generation unit 31A is same to that of the driving voltage generation unit 32A, and a structure of the bit line sense amplifier mat 31B is same to that of the bit line sense amplifier mat 32B.

A pull-up control signal SAP among the driving control signals is input to a gate of a first n-type metal oxide semiconductor (NMOS) transistor NM1 so that an external power supply voltage VDD is supplied to a pull-up node RTO1. A pull-down control signal SAN is input to a gate of a second NMOS transistor NM2 so that a voltage level of a pull-down node SB1 is decreased to a ground voltage VSS. An equalization signal BLEQ is input to an equalization unit 40A connected between the pull-up node RTO1 and the pull-down node SB1 in order to equalize voltage levels loaded on the pull-up node RTO1 and the pull-down node SB1.

Further, the equalization signal BLEQ is also input to a bit line equalization unit (not shown) connected between a bit line pair BL and /BL coupled to the bit line sense amplifier in order to equalize a voltage level of the bit line BL and a voltage level of the bit line bar /BL.

FIG. 3 is a timing diagram showing an operation of the conventional semiconductor memory device.

When the active signal ACT is a logic high level, the equalization signal BLEQ is inactivated and the bit line pair BL and /BL has a small voltage difference. Thereafter, the pull-up control signal SAP and the pull-down control signal SAN are activated as a logic high level and, thus, a voltage level of the pull-up node RTO1 becomes the external power supply voltage VDD and a voltage level of the pull-down node SB1 becomes the ground voltage VSS.

Each bit line sense amplifier receives the voltages loaded on the pull-up node RTO1 and the pull-down node SB1 in order to amplify each data input to each bit line pair BL and /BL. Thereafter, the amplified data are read out by the column selection signal YI<0:255>.

Meanwhile, the pull-up control signal SAP and the pull-down signal SAN are generated as shown in the timing diagram. Herein, referring to FIG. 2, the pull-up control signal SAP and the pull-down control signal SAN are input to the all of the bit line sense amplifiers included in the bit line sense amplifier array 30 at the same time. That is, all of the bit line sense amplifiers included in the bit line sense amplifier array 30 perform a pull-up and a pull-down operations according to the pull-up and the pull-down control signals SAP and SAN.

Therefore, an IR drop due to the power consumption for the operations of the bit line sense amplifiers occurs at resistors, e.g., R1 and R2, shown in FIG. 2. Due to this problem, a higher voltage than a needed minimum external voltage VDD is needed. Further, due to unstable operation, a delay time tRCD between a row address strobe (RAS) signal to a column address strobe (CAS) signal is increased.

SUMMARY OF THE INVENTION

Embodiments of the present invention are directed at providing a semiconductor memory device for selectively operating bit line sense amplifier arrays during a pull-up/pull-down operation in order to reduce power consumption.

In accordance with an aspect of the present invention, there is provided a semiconductor memory device, including: a first bit line sense amplifier array for amplifying a data input to a first bit line pair coupled to cells; a second bit line sense amplifier array for amplifying a data input to a second bit line pair coupled to the cells; and a control unit for activating one of the first and second bit line sense amplifier arrays and, after a predetermined time, for activating the other bit line sense amplifier array in response to an active signal and a column address information signal.

DESCRIPTION OF SPECIFIC EMBODIMENTS

It is an object of the present invention to provide a semiconductor memory device for selectively operating bit line sense amplifier arrays during a pull-up/pull-down operation in order to reduce power consumption. Therefore, in accordance with the present invention, a data access operation can be performed without a loss of a delay time tRCD between a row address strobe (RAS) signal to a column address strobe (CAS) signal and an IR drop can be prevented by reducing power consumption by sequentially enabling bit line sense amplifier arrays.

Hereinafter, a semiconductor memory device in accordance with the present invention will be described in detail referring to the accompanying drawings.

Figure 4:
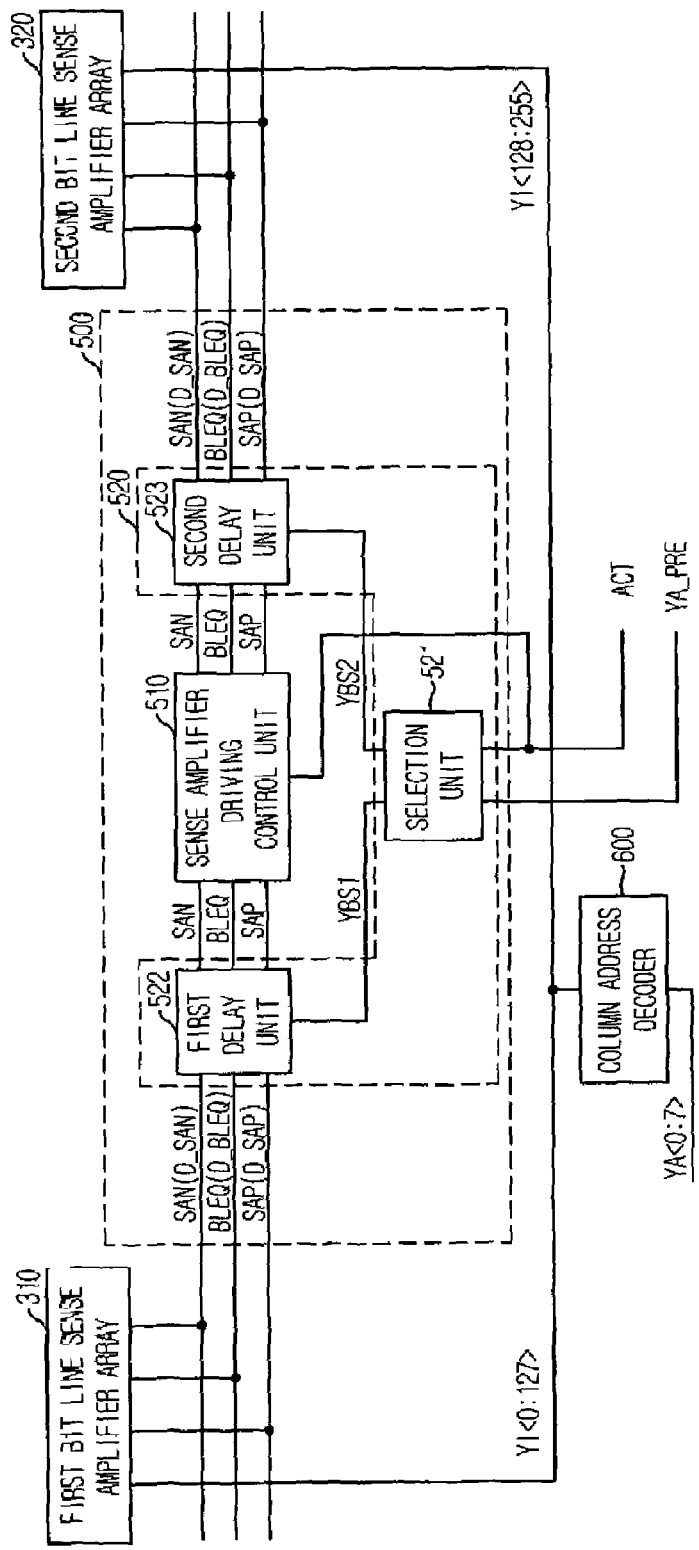
FIG. 4 is a block diagram depicting a bit line sense amplifier array and a control unit included in a semiconductor memory device in accordance with an embodiment of the present invention.

FIG. 4 is a block diagram depicting a bit line sense amplifier array and a control unit included in a semiconductor memory device in accordance with an embodiment of the present invention.

As shown, the semiconductor memory device includes a first bit line sense amplifier array 310, a second bit line sense amplifier array 320 and a control unit 500. In response to an active signal ACT and a column address information signal YA_PRE, the control unit 500 activates one of the first and second bit line sense amplifier arrays 310 and 320 and, after a predetermined time, activates the other bit line sense amplifier array.

Figure 1:
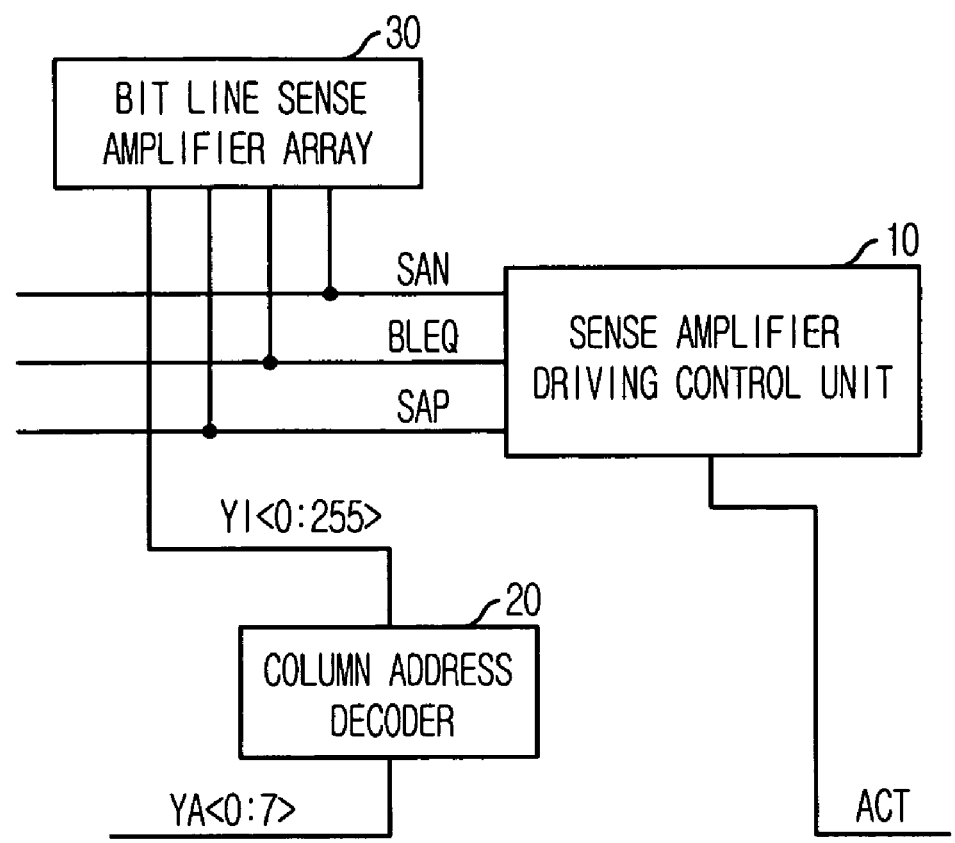
FIG. 1 is a block diagram showing a bit line sense amplifier array and a peripheral circuit included in a conventional semiconductor memory device.
Figure 2:
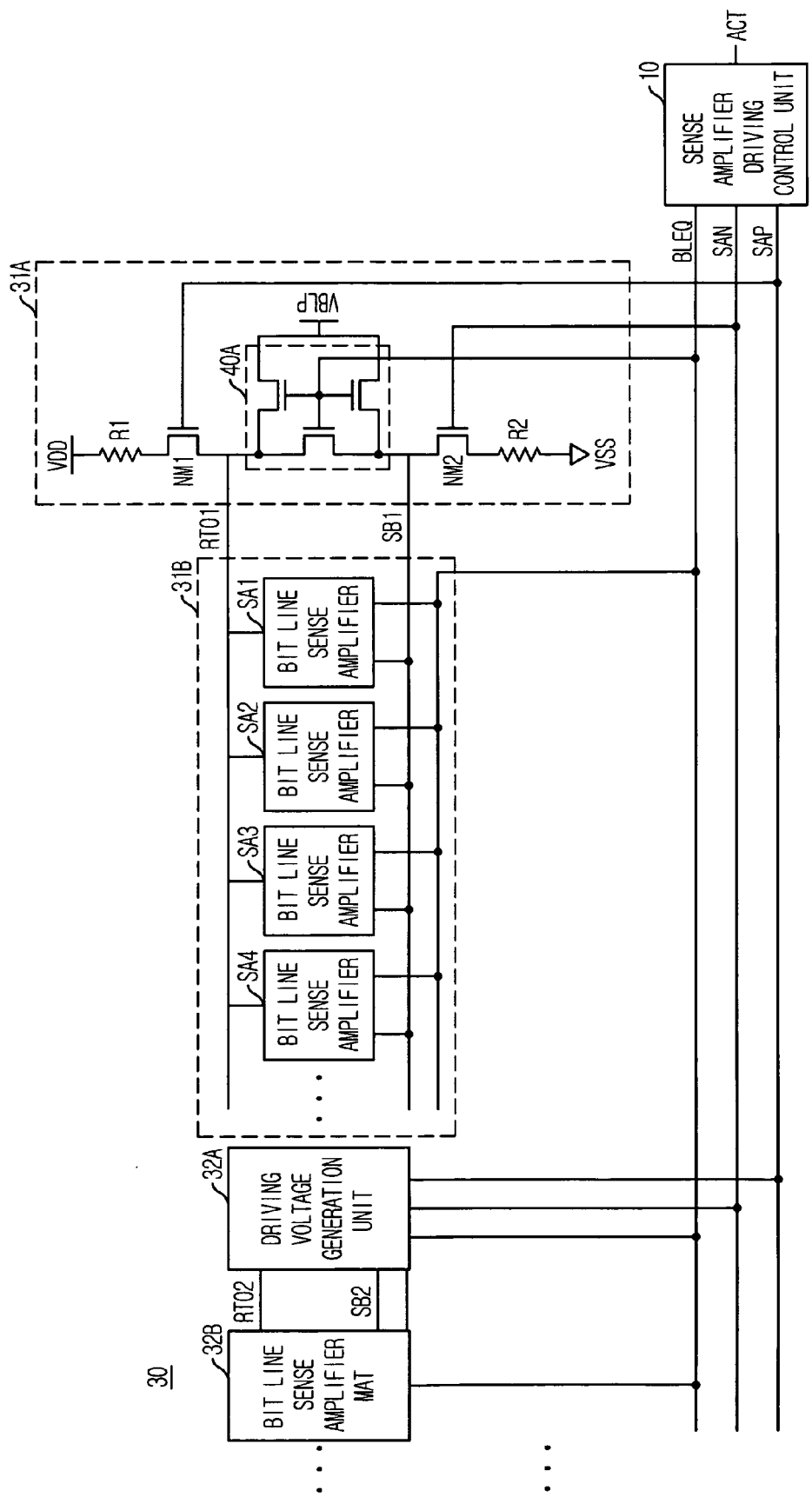
FIG. 2 is a block diagram depicting the bit line sense amplifier array shown in FIG. 1.
Figure 3:
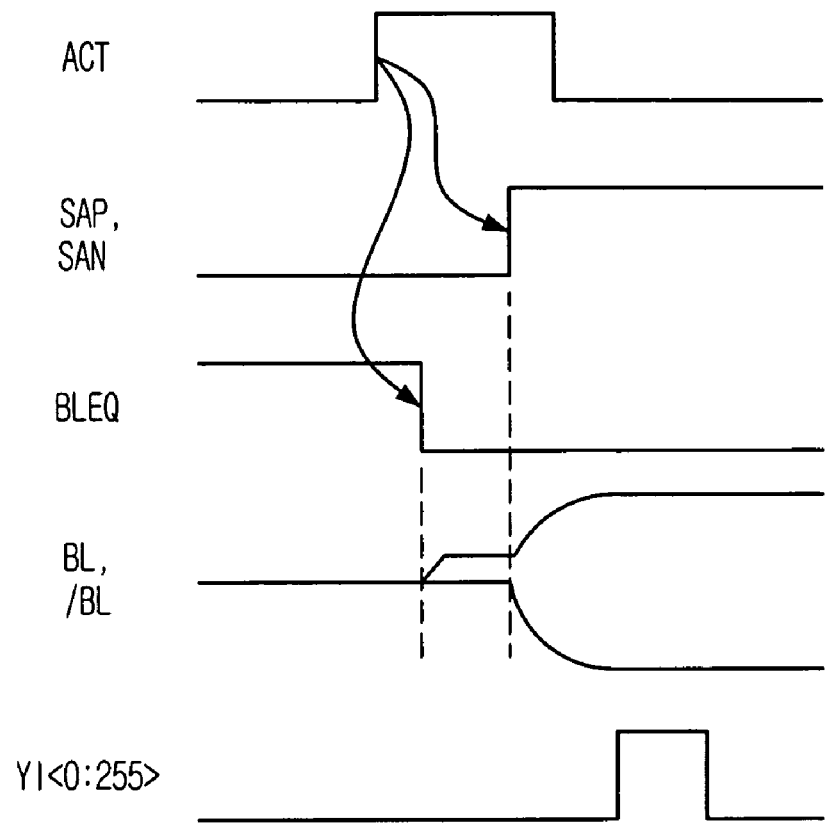
FIG. 3 is a timing diagram showing an operation of the conventional semiconductor memory device.

Herein, an operation of the first and second bit line sense amplifier arrays 310 and 320 is substantially similar to that of the conventional bit line sense amplifier array 30 shown in FIG. 2. However, the number of bit line sense amplifiers included in the first or the second bit line sense amplifier array is half of that of the conventional bit line sense amplifier array 30. That is, the conventional bit line sense amplifier array is divided into two arrays. Depending on a circuit structure, it is possible to divide the conventional bit line sense amplifier array into more than two arrays.

Meanwhile, the control unit 500 includes a sense amplifier driving control unit 510 for generating driving control signals SAN, SAP and BLEQ input to the first and second bit line sense amplifier units 310 and 320 in response to the active signal ACT; and a driving control signal transferring unit 520 for outputting the driving control signals SAN, SAP and BLEQ and, after a predetermined delay time, for outputting delayed driving control signals D_SAN, D_SAP and D_BLEQ in response to the active signal ACT and the column address information signal YA_PRE.

Herein, the driving control signal transferring unit 520 includes a selection unit 521 for generating first and second selection signals YBS1 and YBS2 corresponding to the column address information signal YA_PRE; and first and second delay units 522 and 523 for outputting the driving control signals SAN, SAP and BLEQ or the delayed driving control signals D_SAN, D_SAP and D_BLEQ in response to the first and second selection signals YBS1 and YBS2.

As shown in FIG. 4, the first delay unit 522 is connected between the first bit line sense amplifier array 310 and the sense amplifier driving unit 510 in order to output the driving control signals SAN, SAP and BLEQ or the delayed driving control signals D_SAN, D_SAP and D_BLEQ in response to the first selection signal YBS1. Likewise, the second delay unit 523 is connected between the second bit line sense amplifier array 320 and the sense amplifier driving unit 510 in order to output the driving control signals SAN, SAP and BLEQ or the delayed driving control signals D_SAN, D_SAP and D_BLEQ in response to the second selection signal YBS2.

Figure 5:
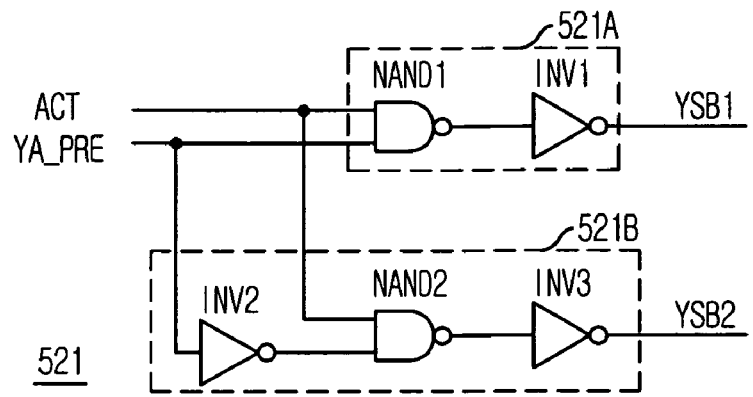
FIG. 5 is a schematic circuit diagram depicting a selection unit shown in FIG. 4.

FIG. 5 is a schematic circuit diagram depicting the selection unit 521 shown in FIG. 4.

As shown, the selection unit 521 includes a first selection signal generation unit 521A for generating the first selection signal YBS1, and a second selection signal generation unit 521B for generating the second selection signal YBS2.

In detail, the first selection unit 521A includes a first NAND gate NAND1 for receiving the active signal ACT and the column address information signal YA_PRE, and a first inverter INV1 for generating the first selection signal YBS1 by inverting an output of the first NAND gate NAND1. The second selection unit 521B includes a second inverter INV2 for inverting the column address information signal YA_PRE, a second NAND gate NAND2 for receiving the active signal ACT and an output of the second inverter INV2, and a third inverter INV3 for generating the second selection signal YBS2 by inverting an output of the second NAND gate NAND2.

Figure 6:
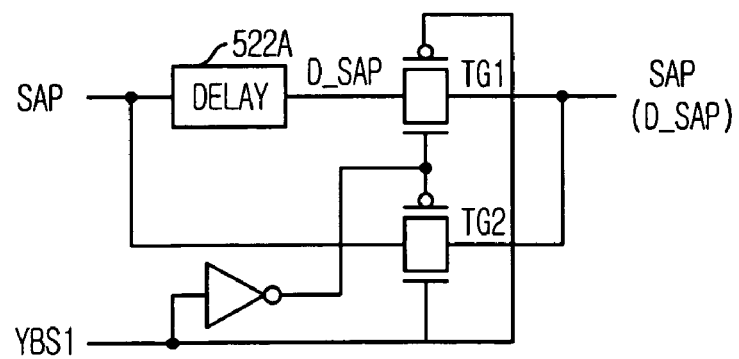
FIG. 6 is a schematic circuit diagram showing a partial circuit of first and second delay units shown in FIG. 4.

FIG. 6 is a schematic circuit diagram showing a partial circuit of the first and second delay units 522 and 523 shown in FIG. 4.

The partial circuit shown in FIG. 6 should be included in the first and second delay units 522 and 523 corresponding to each of the driving control signals SAN, SAP and BLEQ. That is, for instance, if three driving control signals are input to the first delay unit 522, three replicas of the partial circuit should be included in the first delay unit 522. That is, the partial circuit shown in FIG. 6 serves as a template for each one of the driving control signals, i.e., the depicted pull-up control signal SAP.

The partial circuit shown in FIG. 6 outputs the pull-up control signal SAP or, after a predetermined delay time, outputs the delayed pull-up control signal D_SAP according to the first selection signal YBS1.

That is, the pull-up control signal SAP is input to a delay 522A which has the predetermined delay time so that the delayed pull-up control signal D_SAP is generated by the delay 522A. The delayed pull-up control signal D_SAP and the pull-up control signal SAP are respectively input to a first transfer gate TG1 and a second transfer gate TG2. Then, according to the first selection signal YBS1 output from the selection unit 521, the pull-up control signal SAP or the delayed pull-up control signal D_SAP is transferred to the first bit line sense amplifier array 310.

By using an identical structure, the pull-down control signal SAN or the delayed pull-down control signal D_SAN is transferred to the first bit line sense amplifier array 310. Likewise, the equalization signal or the delayed equalization signal D_BLEQ is transferred to the first bit line sense amplifier array 310.

In the same manner, the second delay unit 523 transfers the driving control signals SAN, SAP and BLEQ or the delayed driving control signals D_SAN, D_SAP and D_BLEQ to the second bit line sense amplifier array 320 according to the second selection signal YBS2.

Referring to FIGS. 4 to 6, the selection unit 521 generates the first and second selection signals YBS1 and YBS2 according to the column address information signal YA_PRE. The first selection signal YBS1 determines whether the driving control signals SAN, SAP and BLEQ are delayed or not before the driving control signals SAN, SAP and BLEQ are input to the first bit line sense amplifier array 310. Likewise, the second selection signal YBS2 determines whether the driving control signals SAN, SAP and BLEQ are delayed or not before the driving control signals SAN, SAP and BLEQ are input to the second bit line sense amplifier array 320.

Therefore, the first and second delay units 522 and 523 output the driving control signals SAN, SAP and BLEQ or output the delayed driving control signals D_SAN, D_SAP and D_BLEQ based on the first and second selection signals YBS1 and YBS2.

As a result, one of the first and second bit line sense amplifier arrays 310 and 320 is activated earlier than the other and, after the predetermined delay time, the other bit line sense amplifier array is activated.

Meanwhile, the column address information signal YA_PRE is used for selecting and activating one of the first and second bit line sense amplifier arrays 310 and 320 earlier than the other. For instance, if the bit line pairs amplified by the first and second bit line sense amplifier arrays 310 and 320 can be identified by the upper-most bit among the 8 bits of the column address, the column address information signal YA_PRE relates to the upper-most bit.

Figure 7:
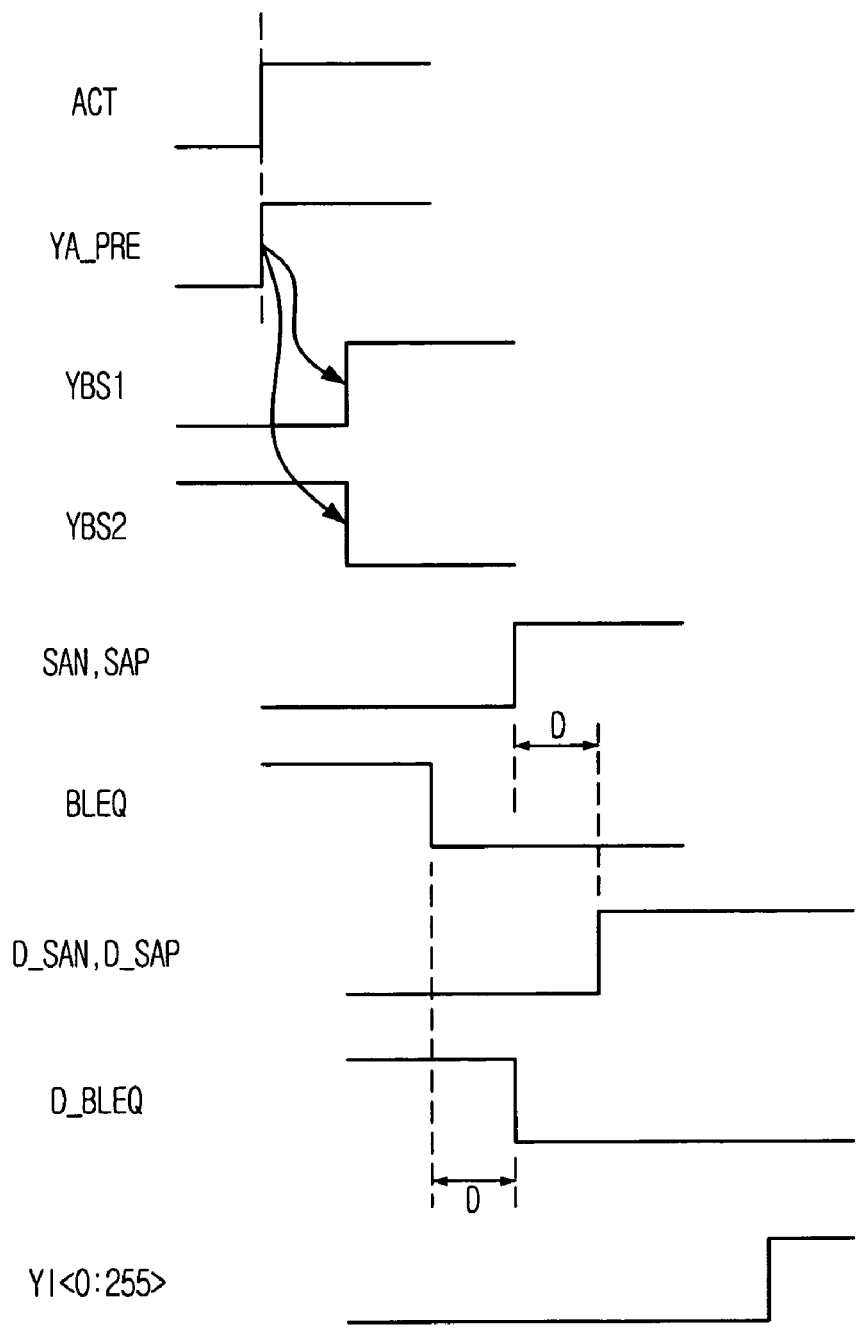
FIG. 7 is a timing diagram showing an operation of the semiconductor memory device shown in FIG. 4.

FIG. 7 is a timing diagram showing an operation of the semiconductor memory device shown in FIG. 4.

After receiving a row address and a column address for initially accessing a desired cell, the active signal ACT and a particular bit of the column address YA<0:7> are input. Herein, the particular bit of the column address YA<0:7> is the column address information signal YA_PRE which contains a column information of the desired cell.

For instance, if a data of the desired cell is amplified by the first bit line sense amplifier array 310, the first selection signal YBS1 becomes a logic high level and the second selection signal YBS2 becomes a logic low level according to the column address information signal YA_PRE. On the contrary, if the data of the desired cell is amplified by the second bit line sense amplifier array 320, the second selection signal YBS2 becomes a logic high level according to the column address information signal YA_PRE. FIG. 7 illustrates the former case.

Meanwhile, the driving control signals SAP, SAN and BLEQ are generated in response to the active signal ACT to be input to the first and second delay units 522 and 523. Herein, the first delay unit 522 which receives a logic high level of the first selection signal YBS1 transfers the driving control signals SAP, SAN and BLEQ to the first bit line sense amplifier array 310, and a data of the desired cell is amplified by the first bit line sense amplifier array 310. The second delay unit 523 which receives a logic low level of the second selection signal YBS2 transfers the delayed driving control signals D_SAP, D_SAN and D_BLEQ to the second bit line sense amplifier array 320. The delay amount of the delayed driving control signals D_SAP, D_SAN and D_BLEQ is indicated with a 'D' in FIG. 7.

Further, the column selection signal YI<0:255> generated by decoding the column address signal YA<0:7> is desirably one of the column selection signal YI<0:127>. Therefore, it is possible to read the desired data amplified by the first bit line sense amplifier array 310 without the loss of the delay time tRCD between the RAS signal to the CAS signal.

As mentioned above, the control unit 500 receives the active signal ACT and the particular bit of the column address signal YA<0:7> at the same time. Accordingly, one of the bit line sense amplifier arrays which contains the desired data is operated earlier than the other, and the amplified data is read out without the loss of the RAS to CAS delay tRCD by the column selection signal YI<0:256> generated by decoding the column address signal YA<0:7>.

Further, since the one of the first and second bit line sense amplifier arrays 310 and 320 is operated earlier than the other and, after the predetermined delay time, the other bit line sense amplifier array is operated, power consumption can be reduced.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
    a first bit line sense amplifier array for amplifying a data input to a first bit line pair coupled to cells;
    a second bit line sense amplifier array for amplifying a data input to a second bit line pair coupled to the cells; and
    a control unit for activating one of the first and second bit line sense amplifier arrays and, after a predetermined time, for activating the other bit line sense amplifier array in response to an active signal and a column address information signal,
    wherein the control unit includes a driving control signal transferring unit having a selection unit and a delay unit,
    wherein the selection unit generates first and second selection signals in response to the active signal and the column address information signal, and the delay unit outputs driving control signals or delayed driving control signals in response to the first and second selection signals.

2. The semiconductor memory device as recited in claim 1, wherein the control unit further includes:
    a sense amplifier driving control unit for generating the driving control signals in order to drive the first and second bit line sense amplifier arrays in response to the active signal,
    wherein the driving control signal transferring unit transfers the driving control signals to one of the first and second bit line sense amplifier arrays and transfers the delayed driving control signals to the other bit line sense amplifier array by delaying the driving control signals for the predetermined time in response to the active signal and the column address signal.

3. The semiconductor memory device as recited in claim 1, wherein the delay unit includes:
    a first delay unit connected between the first bit line sense amplifier array and the sense amplifier driving control unit for outputting one of the driving control signals and the delayed driving control signals to the first bit line sense amplifier array in response to the first selection signal; and
    a second delay unit connected between the second bit line sense amplifier array and the sense amplifier driving control unit for outputting one of the driving control signals and the delayed driving control signals to the second bit line sense amplifier array in response to the second selection signal.

4. The semiconductor memory device as recited in claim 3, wherein the selection unit includes:
    a first selection signal generation unit for generating the first selection signal for determining whether the driving control signals are delayed or not before the driving control signals are input to the first bit line sense amplifier array in response to the active signal and the column address information signal; and
    a second selection signal generation unit for generating a second selection signal for determining whether the driving control signals are delayed or not before the driving control signals are input to the second bit line sense amplifier array in response to the active signal and the column address information signal.

5. The semiconductor memory device as recited in claim 4, wherein the first selection signal generation unit includes:
   a NAND gate for receiving the active signal and the column address information signal; and
   an inverter for generating the first selection signal by inverting an output of the NAND gate.

6. The semiconductor memory device as recited in claim 4, wherein the second selection signal generation unit includes:
   a first inverter for inverting the column address information signal;
   a NAND gate for receiving the active signal and an output of the first inverter; and
   a second inverter for generating the second selection signal by inverting an output of the NAND gate.

7. The semiconductor memory device as recited in claim 4, wherein the first delay unit includes:
   a delay circuit for delaying the driving control signals for the predetermined time; and
   a transferring unit for transferring one of the driving control signals and the outputs of the delay circuit in response to the first selection signal.

8. The semiconductor memory device as recited in claim 3, wherein the second delay unit includes:
   a delay circuit for delaying the driving control signals for the predetermined time; and
   a transferring unit for transferring one of the driving control signals and the outputs of the delay circuit in response to the second selection signal.

9. The semiconductor memory device as recited in claim 8, wherein each of the first and second bit line sense amplifier arrays includes:
   at least one driving voltage generation unit for generating first and second driving voltages in response to the driving control signals; and
   a bit line sense amplifier array having a plurality of bit line sense amplifiers supplied with the first and second driving voltages.

10. The semiconductor memory device as recited in claim 9, wherein the driving control signals include:
    an equalization signal for equalizing voltage levels loaded on nodes supplied with the first and second driving voltages and voltage levels of the first and second bit line pairs;
    a pull-up control signal for supplying the first driving voltage; and
    a pull-down control signal for supplying the second driving voltage.

11. The semiconductor memory device as recited in claim 10, wherein the delay circuit comprises unit delays corresponding to the pull-up control signal, the pull-down control signal and the equalization signal respectively.

12. The semiconductor memory device as recited in claim 1, wherein the column address information signal is the upper-most bit of the column address for selecting one of the first and second bit line sense amplifier arrays earlier than the other.

13. The semiconductor memory device as recited in claim 1, further comprising a column decoder for decoding the column address to generate a column selection signal.

14. A semiconductor memory device, comprising:
    a first bit line sense amplifier array for amplifying a data input to a first bit line pair coupled to cells;
    a second bit line sense amplifier array for amplifying a data input to a second bit line pair coupled to the cells; and
    a control unit for activating one of the first and second bit line sense amplifier arrays and, after a predetermined time, for activating the other bit line sense amplifier array in response to an active signal and a column address information signal,
    wherein each of the first and second bit line sense amplifier arrays includes:
    at least one driving voltage generation unit for generating first and second driving voltages in response to driving control signals; and
    a bit line sense amplifier array having a plurality of bit line sense amplifiers supplied with the first and second driving voltages.

* * * * *